United States Patent [19]
Yokouchi et al.

[11] Patent Number: 5,593,526
[45] Date of Patent: Jan. 14, 1997

[54] PROCESS FOR PREPARING A MULTI-LAYER WIRING BOARD

[75] Inventors: Kishio Yokouchi; Hiroshi Kamezaki; Masato Wakamura; Nobuo Kamehara; Koichi Niwa, all of Kawasaki, Japan

[73] Assignee: Fujitsu Limited, Kawasaki, Japan

[21] Appl. No.: 316,376

[22] Filed: Sep. 30, 1994

Related U.S. Application Data

[60] Continuation of Ser. No. 107,007, Aug. 17, 1993, abandoned, which is a division of Ser. No. 763,248, Sep. 20, 1991, Pat. No. 5,275,889.

[30] Foreign Application Priority Data

Sep. 20, 1990 [JP] Japan ................................ 2-252500

[51] Int. Cl.$^6$ .................................................. C04B 37/00
[52] U.S. Cl. .................................. 156/89; 264/61
[58] Field of Search ............................... 264/63, 61, 122, 264/175, 177.1, 212; 427/215; 156/89

[56] References Cited

U.S. PATENT DOCUMENTS

| | | | |
|---|---|---|---|
| 4,518,737 | 5/1985 | Traut | 264/122 |
| 4,781,968 | 11/1988 | Kellerman | 428/209 |

*Primary Examiner*—Christopher A. Fiorilla
*Attorney, Agent, or Firm*—Staas & Halsey

[57] ABSTRACT

A process for producing a multi-layer wiring board having alternate layers of a glass ceramic material and conductor patterns. The glass ceramic layers are made up of a glass ceramic material including a glass matrix and ceramic particles dispersed in the matrix. The glass ceramic layers are caused to contain hollow or porous silica glass spheres dispersed in the glass ceramic material. The hollow or porous silica glass spheres are covered with a ceramic coating layer containing alumina as a constituent element. Such a structure prevents crystallization of the silica spheres and avoids the resultant rapid increase in the the thermal expansion coefficient of the glass ceramic layers. The structure provided by the process of the invention also precludes the formation of pores in the surfaces of the glass ceramic layers.

25 Claims, 3 Drawing Sheets

PROCESS FOR PREPARING A MULTI-LAYER WIRING BOARD

This application is a continuation of application Ser. No. 08/107,007, filed Aug. 17, 1993, now abandoned which is a division of application Ser. No. 07/763,248, filed Sep. 20, 1991, now U.S. Pat. No. 5,275,889.

PROCESS FOR PREPARING A MULTI-LAYER WIRING BOARD

1. Field of the Invention

The present invention relates to a glass ceramic multi-layer wiring board including a circuit pattern of an excellent conductor such as copper and having a low dielectric constant, and to a process for making a glass ceramic green sheet to be used in the multi-layer wiring board.

2. Description of the Related Art

To treat a large quantity of information at a high speed the frequency of the signal is increased and often an optical communication means is utilized.

In a multi-layer wiring or circuit board having an electric circuit for treating such high speed signals, the retardation time τ of electric signals must be as short as possible and cross-talk between the conductor lines must be as low as possible, and accordingly, the electric constant ε of the board must be small, as shown by the following formula (1):

$$\tau = \epsilon^{1/2}/C \tag{1}$$

where ε is the dielectric constant of the board and C is the velocity of light. Also, to lower transmission losses, it is necessary to form electric circuits on and in the board from a pattern of a metal material having a low electrical resistance.

In accordance with the present invention, it is proposed to use a glass ceramic as a board material, and copper as the electric circuit material. Green sheets containing a ceramic such as alumina ($Al_2O_3$, ε=0) and mullite ($3Al_2O_3 \cdot 2SiO_2$, ε=7) as a main component require a firing temperature of more than 1000° C., but glass ceramic green sheets containing powders of such ceramic materials and of a glass such as a borosilicate glass as main components can be fired at a temperature lower than 1000° C., which allows copper having a melting point of 1084° C. to be used as a circuit pattern conductor material.

Nevertheless, such glass ceramic boards have a dielectric constant of 4 to 6, which is not low enough to shorten the information retardation time.

The present invention relates to a multi-layer circuit board of a glass ceramic material having hollow or porous silica glass spheres dispersed therein. Such board materials containing dispersed hollow or porous spheres are known, as described below.

Japanese Unexamined Patent Publication (Kokai) No. 59-111345 discloses a circuit board of a ceramic material containing dispersed hollow spheres. Inorganic particles such as hollow alumina spheres are used as a hollow sphere.

Japanese Unexamined Patent Publication (Kokai) No. 62-206861 discloses a ceramic multi-layer board having an insulating layer in which hollow ceramic particles are dispersed in a ceramic matrix. The disclosed layer has a dielectric constant of less than 5 and a bending strength of more than 5 kg/mm². The hollow ceramic particles which are used in this layer are hollow silica spheres, and the ceramic matrix is prepared from an originally amorphous material which forms crystals in the matrix when subjected to heat treatment, i.e., the matrix material becomes a crystallized glass, to thus improve the strength of the board.

Japanese Unexamined Patent Publication (Kokai) No. 62-287658 discloses a multi-layer laminated circuit board having alternate ceramic layers and wiring layers, in which the ceramic layers comprise a glass having a softened point lower than the melting point of the wiring layer. Hollow silica particles having diameters of less than 100 μm are dispersed in the glass matrixes.

Japanese Unexamined Patent Publication (Kokai) No. 2-83995 discloses a laminated multi-layer circuit board having alternate wiring layers and insulating layers. The insulating layers have two regions having different porosities, and the region having the larger porosity is in contact with a wiring layer.

Japanese Unexamined Patent Publication (Kokai) No. 63-358 discloses a material having a low dielectric constant in the form of a thick film comprising a generally uniform mixture of hollow glass spheres and a glass ceramic material. The hollow glass spheres, the glass ceramic material and an organic vehicle are mixed and coated on a support layer of, for example, alumina having a metal pattern formed thereon. The mixture is then dried to obtain an insulating board.

As described above, many examples of the use of hollow spheres in an insulating matrix having been disclosed, but none of these disclosures reveal any countermeasure for the crystallization of silica spheres to form cristobalite thereby causing a rapid increase in the thermal expansion coefficient of the matrix, or for the formation of pores in the surfaces of the silica spheres as a result of the heat treatment. The above publications, however, do reveal the concept of accelerating the crystallization of the silica spheres, to thus increase the strength of a board.

A ceramic multi-layer board which includes an electric circuit of the sort required for high speed transmission of signals, as in a supercomputer, must satisfy the following conditions:

(1) A metal material having low electrical resistance, such as copper, is used as the wiring or conductor material.

(2) The dielectric constant is as low as possible.

(3) The thermal expansion coefficient of the board is close to that of a silicon semiconductor.

Glass ceramic boards generally satisfy conditions (1) and (3), but do not satisfy condition (2). That is to say, the glass ceramics have a firing temperature of less than 1000° C., thereby allowing the wiring pattern to be made of copper. The thermal expansion coefficient of the board is caused to be close to the $3.5 \times 10^{-6}$/° C. coefficient of silicon by appropriately selecting the glass which is used as the starting material. For example, appropriate selections include borosilicate, lead borosilicate or aluminoborosilicate. Nevertheless, the dielectric constant is disadvantageously as high as 4 to 6.

Thus, the purpose of the present invention is to provide a multi-layer board which satisfies all of the above conditions (1) to (3), and wherein the dielectric constant is not higher than 4.

SUMMARY OF THE INVENTION

The foregoing object of the present invention is achieved by providing a multi-layer wiring board comprising a laminate of glass ceramic layers and conductor patterns, wherein said glass ceramic layers are made of a glass ceramic material comprising a glass matrix having ceramic particles dispersed therein. The ceramic particles comprise hollow or porous silica glass spheres which are dispersed in the glass ceramic matrix, and the hollow or porous silica glass spheres are covered with a ceramic coating layer containing aluminum as a constituent element.

Ceramic green sheets for preparing the glass ceramic layers are made by combining and kneading hollow or porous silica glass spheres, glass powder, ceramic powder, a binder resin, a plasticizer and a solvent, and then forming the resultant slurry into ceramic green sheets. In accordance with the invention, the hollow or porous silica glass spheres are covered with a ceramic coating layer containing aluminum as a constituent element.

DESCRIPTION OF THE PREFERRED EMBODIMENTS

Figure 1:
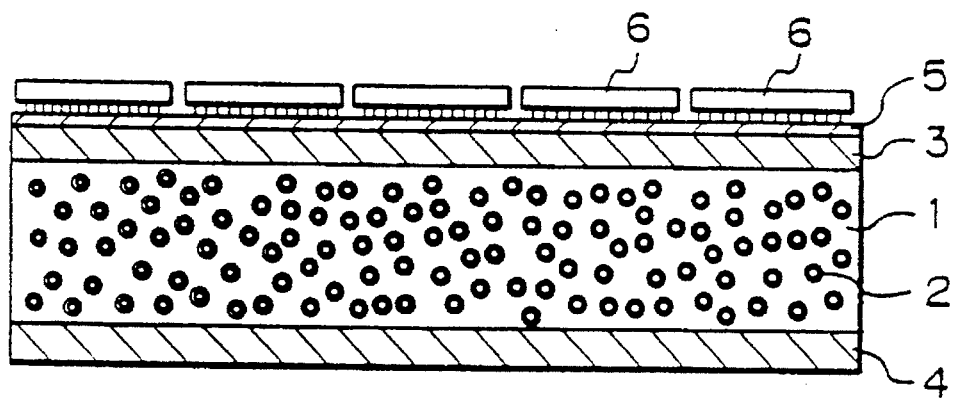
FIG. 1 is a cross-sectional view of a multi-layer wiring board of the present invention.

The hollow or porous silica glass spheres used in the present invention may also be called hollow or porous quartz glass spheres, because they contain more than 90% by weight, preferably more than 93% by weight, of silica, with the remainder being boron oxide or alkali metals, etc.

Silica has a dielectric constant $\epsilon$ of 3.8, the lowest among inorganic dielectrics, and the dielectric constant can be further reduced in a hollow or porous body of a composite of silica and air. The dielectric constant $\epsilon$ of the composite is as shown below:

$$\epsilon_0 = (\epsilon_1 \cdot \epsilon_2)/(\epsilon_1 V_2 + \epsilon_2 V_1) \quad (2)$$

where $\epsilon_0$ is the composite dielectric constant, $V_1$ is the ratio of the volume occupied by the dielectric having a dielectric constant $\epsilon_1$ (in this case quartz) to the total volume of the composite, and $V_2$ is the ratio of the volume occupied by the dielectric having a dielectric constant $\epsilon_2$ (in this case air) to the total volume of the composite.

Hollow silica glass spheres or hollow quartz glass spheres may be made by pyrolysis of an organic silicon compound such as methoxysilicate $Si(OCH_3)_4$ or ethoxysilicate $Si(OC_2H_5)_4$. During such pyrolysis a constituent component is separated in the form of balloons. Such hollow silica glass spheres are sold, for example, under the trade name of "Microballoon" by Fuji Davison Chemical Ltd. The porous silica glass spheres or porous quartz glass spheres may be made by pulverizing a porous mass of silica or quartz.

The hollow silica glass spheres have a softening temperature of 900° to 1000° C. or more, typically 950° C.

Hollow silica or quartz glass spheres having a particle size larger than 100 µm are used as a filler for concrete, or as a material for lowering the weight of resin articles. In accordance with the present invention, hollow or porous silica particles having an average particle size not larger than 20 µm are used instead of the ceramic particles used in a glass ceramic, to thereby provide a multi-layer glass ceramic board having a low dielectric constant. Thus, green sheets are made using hollow or silica spheres and glass, as main components.

When hollow or porous silica spheres are used, however, the following problems arise:

(1) When heated, silica spheres are phase transformed into cristobalite, i.e., a crystallization occurs and the thermal expansion coefficient rapidly increases to about $1 \times 10^{-5}$.

(2) Since hollow silica spheres made by pyrolysis of an organic silicon compound having a softening temperature of about 950° C., which is lower than that of a ceramic such as alumina, it is necessary to raise the softening temperature to about 1050° C. to obtain a reliable board.

To solve these problems, according to the present invention, the hollow or porous silica spheres are covered with a ceramic coating layer containing aluminum as a constituent element, and as a result:

(1) Crystallization of the silica glass is prevented by the presence of the ceramic coating layer containing aluminum as a constituent element. Although this has not been confirmed, it is assumed that the aluminum is diffused into or acts with the silica to prevent the crystallization of the silica glass, whereby a rapid increase in the thermal expansion coefficient and the formation of pores in the surface of the spheres, due to crystallization, are both prevented.

(2) The presence of a ceramic coating layer on the hollow or porous silica spheres enables an improvement of the softening temperature of the hollow or porous silica spheres to 1050° C.

The ceramic coating layer containing aluminum as a constituent element may be formed of alumina, mullite, spinel, aluminum nitride, etc., so long as it contains aluminum as a constituent element and is a ceramic having a softening or melting point higher than 1050° C.

The ceramic coating layer containing aluminum as a constituent element may be formed on the surface of the hollow or porous silica spheres by any known process, for example, by a chemical vapor deposition (CVD) or pyrolysis, or by plating a metal layer onto the spheres and then applying heat to form an oxide, or by dipping the spheres in a slurry of a ceramic and then heating the same, etc.

The surface of the hollow silica microspheres can be coated with an inorganic substance such as an $Al_2O_3$ ceramic by the sol-gel method. If the microspheres are to be coated with aluminum isopropoxide, $Al[OCH(CH_3)_2]_3$ is used as a starting material.

To coat the surface of hollow silica microspheres with an alumina film according to the sol-gel method, 50 g of hollow silica microspheres having an average particle size of 10 µm are added to a solution prepared from 100 g of $Al[OCH(CH_3)_2]_3$, 140 g of $C_2H_5OH$, 80 g of $H_2O$ and 1.2 g of HCl. The aluminum alkoxide solution is stirred to activate hydrolysis of the solution to some extent. When gelation of the solution has been initiated, the solution, including the hollow silica microspheres, is dried by spray-drying. The resulting powder is heated to 1000° C. in air in an electric furnace so that the coating film undergoes a dehydration-condensation reaction to thus give a compact alumina film.

The thickness of the ceramics coating layer is not critical.

The hollow or porous silica spheres may be contained in an amount of up to 50% by volume, typically about 30% by volume, of the glass ceramic layer.

The glass ceramic of the glass ceramic layers comprises glass and ceramic particles dispersed in the glass. The glass has a softening temperature of about 700° to 900° C., i.e., the glass is softened but not fused at the firing temperature of the glass ceramic layers. Such a glass may be, for example, borosilicate glass, lead borosilicate glass or aluminoborosilicate glass. Borosilicate glass typically has a relatively low dielectric constant of 4.1 to 4.6.

The ceramic particles are used in the glass ceramic as a reinforcement and for prevention of crystallization thereof. Examples of the ceramic particles are alumina ($\epsilon=10$), mullite ($\epsilon=7$), spinel, aluminum nitride, etc. The average particle size of the ceramic particles is generally up to 10 μm, preferably 3 to 4 μm, and the amount of the ceramic particles is generally up to 50% by volume, preferably 20 to 40% by volume, more preferably 25 to 35% by volume, of the glass ceramic layer.

The glass ceramic layer is made by firing a green sheet of the glass ceramic. The green sheet for the glass ceramic layer of the present invention may be made by combining and kneading hollow or porous silica glass spheres, a glass powder, a ceramics powder, a binder resin, a plasticizer and a solvent, and then forming the resultant slurry into a ceramic green sheet. As set forth above, the hollow or porous silica glass spheres are covered with a ceramic coating layer containing aluminum as a constituent element.

The glass powders used have an average particle size of up to 10 μm, preferably 2 to 3 μm, and the process used for making green sheets is the same as the conventional process except for the addition of the hollow or porous silica glass spheres. A typical thickness of the green sheet is 600 to 300 μm.

The green sheet is cut to a predetermined size and laminated alternately with conductor patterns, to thus form a laminate. The number of layers of the laminate is, for example 70 to 80, and after through holes are formed in the laminate, the laminate is fired.

A preferred conductor is copper, but white silver and platinum, etc., may be used.

The firing temperature of a copper conductor is 900° to 1010° C., typically 980° C., and the firing atmosphere is wet nitrogen, but air may be used for silver or platinum, etc.

The glass ceramic green sheet comprising borosilicate glass and ceramic particles may be fired at 1010° C., but if hollow or porous silica glass spheres without the ceramic coating layer of the present invention are added to the glass ceramic green sheet, the firing temperature should be lowered to 960° C., to ensure good densification when sintered. If the density of the sintered board is lowered, the strength of the board is lowered and the water absorption rate is increased, and thus the reliability of the board is lowered. Nevertheless, by incorporating hollow or porous silica glass spheres covered with the ceramic coating layer of the present invention into the glass ceramic green sheet, the firing temperature may be, for example, 980° C. to 1010° C., and the board can be densely sintered without the occurrence of problems such as crystallization of the silica spheres.

When manufacturing a multi-layer board, the top and bottom surfaces are polished to provide a smooth surface on which a circuit pattern is to be formed. If the glass ceramic contains hollow or porous spheres, and the surfaces of the board are polished, pores will be formed in the surfaces of the hollow or porous spheres and the surfaces of the board will be roughened. To solve this problem, a small number of glass ceramic layers comprising a glass ceramic and ceramic particles, but not containing hollow or porous spheres, are further laminated at both surfaces of the laminate of glass ceramic layers comprising a glass ceramic and ceramic particles as well as hollow or porous spheres, and thus the surfaces of the laminate or board remain smooth after polishing. Of course, the content of ceramic particles in the layers on opposite sides of the board may be increased, because the hollow or porous spheres are eliminated.

FIG. 1 shows the structure of a multi-layer wiring board of the present invention. In FIG. 1, the body of the multi-layer wiring board 1 comprising a laminate of wiring layers (not shown) and glass ceramic layers containing hollow silica spheres 2. Glass ceramic layers 3 and 4 are formed on both surfaces of the body of the multi-layer wiring board 1 and polished. A circuit pattern of a conductor 5 is formed on the polished surfaces and LSIs 6 are mounted on the circuit pattern.

EXAMPLES

Example 1

Hollow silica spheres (Microballoons sold by Fuji Davison Chemical Ltd.) have an average particle size of 20 μm and aluminum sulfate $Al_2(SO_4)_3$ were mixed and dried so as to deposit an aluminum sulfate layer $Al_2(SO_4)_3$ on the surfaces of the hollow silica spheres. The spheres were then heated at 1000° C. to obtain hollow silica spheres having a layer of $Al_2O_3$ coated on the surfaces thereof.

The following composition was kneaded and formed into a green sheet having a thickness of 300 μm, by a doctor blade method.

| | |
|---|---|
| Coated hollow silica spheres | 100 g |
| Borosilicate glass | 200 g |
| Mullite particles | 200 g |
| Polyvinyl buthylal (binder) | 50 g |
| Dibutylphthalate (plasticizer) | 30 g |
| Methylethylketone (solvent) | 50 g |
| Acetone (solvent) | 100 g |

In this green sheet, a wiring pattern and through holes were formed using a Cu paste, 30 of the obtained green sheets were formed into a laminate. Green sheets made using silica particles instead of the hollow silica spheres were further laminated on the top and bottom surfaces of the laminate. The laminate was then subjected to isostatic pressing at 10 MPa and heating in a nitrogen atmosphere at 1000° C., to obtain a multi-layer glass ceramic wiring board.

The thus obtained multi-layer glass ceramic wiring board was not deformed, and the silica spheres inside the board were not crystallized. The dielectric constant of the board was 3.5, and the board thus was suitable for use as a wiring board for high frequency transmission.

Example 2

The procedures of Example 1 were repeated to obtain a multi-layer glass ceramic wiring board, except that aluminoborosilicate glass was used instead of borosilicate glass.

The thus obtained multi-layer glass ceramics wiring board was not deformed and the silica spheres inside the board were not crystallized. The dielectric constant of the board was about 3.5, and the thermal expansion coefficient of the board was $3.5 \times 10^{-6}$, i.e., the same as that of silicon.

Figure 2:
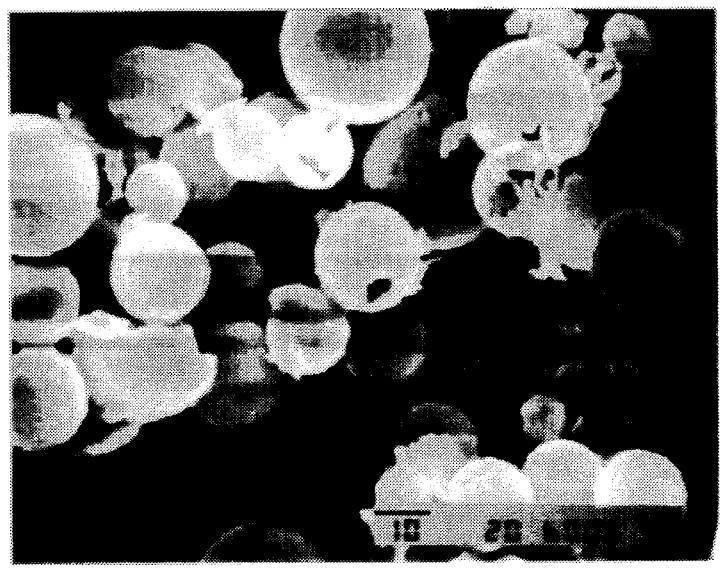
FIGS. 2 to 4 are photographs taken by an SEM of conventional silica spheres after being heat treated at 1100° C.
Figure 3:
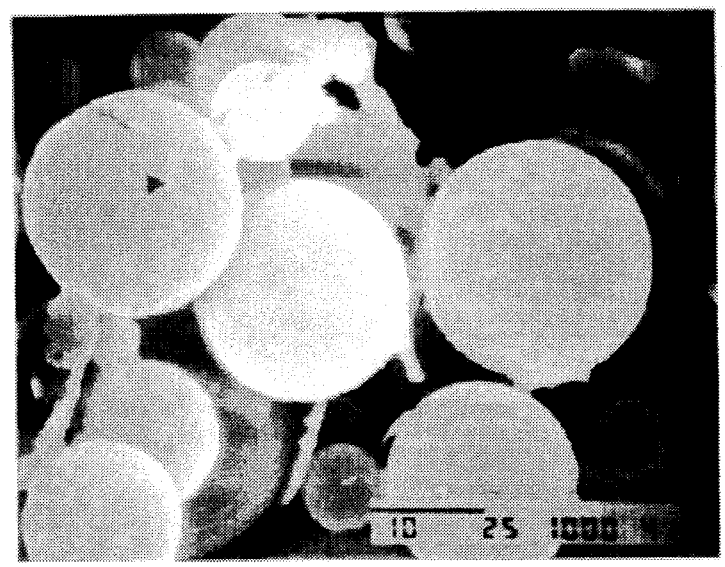
Figure 4:
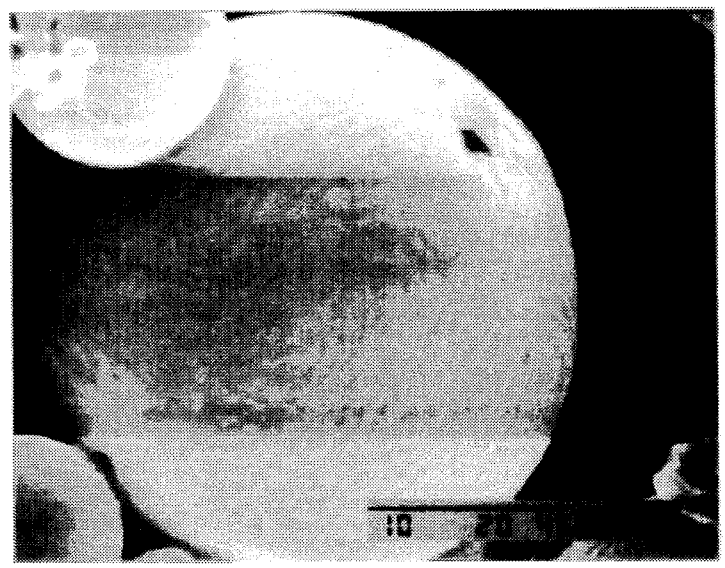
Figure 5:
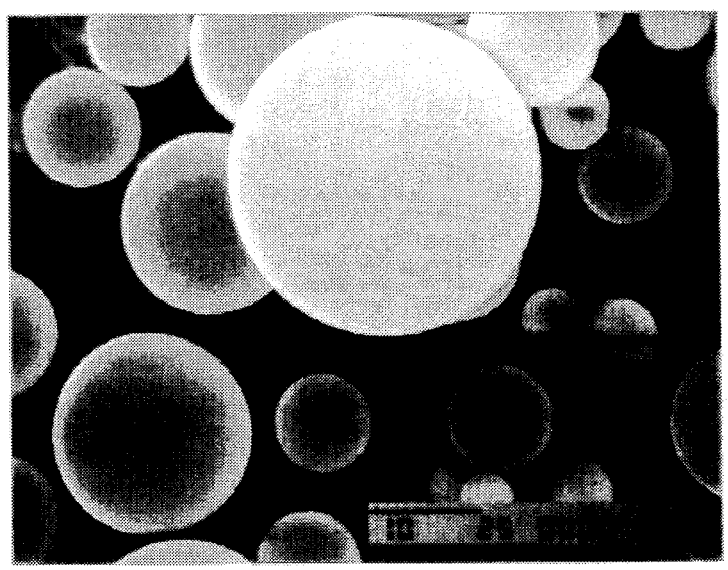
FIG. 5 is an SEM photograph of silica spheres with an $Al_2O_3$ coating after being heat treated at 1100° C.

FIGS. 2 to 4 are photographs of silica spheres without a ceramic coating after heat treatment at 1100° C. taken by an SEM. The enlargement magnitudes of the SEM photographs are ×500 in FIG. 2, ×1000 in FIG. 3, and ×5000 in FIG. 4. These photographs of FIGS. 2 to 4 clearly show the phase separation and pores. FIG. 5 is a photograph of silica spheres with an $Al_2O_3$ coating after heat treatment at 1100° C., taken by an SEM at a magnitude of ×1000. The photograph of FIG. 5 shows that no phase separation occurred and pores formed.

We claim:

1. A process for producing a multi-layer wiring board having a dielectric constant not higher than 4 and which comprises alternate layers of a glass ceramic material and conductor patterns, said glass ceramic material layers each being made up of a fired admixture comprising a glass ceramic matrix and a multitude of ceramic particles dispersed in the glass ceramic matrix, said process comprising:

providing a multitude of ceramic particles comprising porous or hollow silica glass spheres having an average diameter of not more than 20 μm, said spheres being covered with an aluminum containing ceramic coating layer which prevents crystallization of the spheres as a result of a firing process for sintering the glass ceramic layers and which raises the softening temperature of the spheres to a temperature higher than a firing temperature of a firing process required to produce a highly reliable multi-layer wiring board;

mixing glass powders, said multitude of ceramics particles, a binder resin, a plasticizer, and a solvent to thereby form a slurry;

forming said slurry into ceramics green sheets;

cutting the ceramics green sheets to a predetermined size and forming through holes therein;

forming a conductor pattern on the ceramics green sheets;

stacking the green sheets having the conductor patterns thereon on and the through holes therein to present a laminate structure;

subjecting said laminate structure to isostatic pressing; and firing the isostatically pressed laminate structure at a temperature of from 980° C. to 1010° C.

2. A process for producing a multi-layer wiring board as set forth in claim 1, said process further comprising:

forming a second slurry by mixing glass powders, ceramics powders which are not the same as said ceramic particles, a binder resin, a plasticizer, and a solvent;

forming said second slurry into second ceramics green sheets;

cutting the second ceramics green sheets to a predetermined size and forming through holes of copper, silver or platinum therein;

placing respective second ceramics green sheets at the top and bottom of said laminate structure prior to said isostatic pressing whereby the fired laminate structure has a second glass ceramic layer on each side thereof;

polishing the second glass ceramics layers of the fired structure; and forming a circuit pattern on at least one of said polished surfaces.

3. A process according to claim 1, wherein said ceramic coating layer is alumina, mullite, spinel or aluminum nitride.

4. A process according to claim 1, wherein said silica glass spheres comprise more than 90% by weight of silica.

5. A process according to claim 1, wherein said silica glass spheres comprise not more than 50% by volume of a respective glass ceramic layer.

6. A process according to claim 1, wherein said glass ceramic material has a softening temperature in the range of from 700° to 900° C., said ceramic particles have an average particle size of not more than 10 μm, and said particles comprise not less than 10% by volume of the glass ceramic material layers.

7. A process according to claim 1, wherein said conductor patterns are copper.

8. A process according to claim 1, wherein said silica glass spheres comprise not more than 50% by volume of a respective ceramics green sheets.

9. A process according to claim 1, wherein said silica glass spheres are coated with said aluminum containing ceramic coating layer by chemical vapor deposition (CVD).

10. A process according to claim 1, wherein said silica glass spheres are coated with said aluminum containing ceramic coating layer by pyrolysis.

11. A process according to claim 1, wherein said silica glass spheres are coated with said aluminum containing ceramic coating layer by plating a metal layer and then applying heat thereto to form an oxide.

12. A process according to claim 1, wherein said silica glass spheres are coated with said aluminum containing ceramic coating layer by dipping the spheres in a slurry of a ceramic and then heating the same.

13. A process according to claim 1, wherein said silica glass spheres are coated with said aluminum containing ceramic coating layer by a sol-gel method using an organic aluminum compound and spray-drying and then heating the same.

14. A process according to claim 1, wherein said silica glass spheres are coated with said aluminum containing ceramic coating layer by dipping the spheres in an inorganic aluminum compound solution and drying and then heating the same.

15. A process according to claim 1, wherein said conductor patterns are silver.

16. A process according to claim 1, wherein said conductor patterns are platinum.

17. A process for producing a green sheet for use in preparing a glass ceramic material for a multi-layer wiring board having a dielectric constant not higher than 4 and which comprises alternate layers of a glass ceramic material and conductor patterns, said green sheet comprising an unfired admixture of a glass powder and a ceramics powder including a multitude of ceramic particles dispersed in the admixture, said process comprising:

providing a multitude of ceramic particles comprising hollow or porous silica glass spheres having an average diameter of not more than 20 μm, said spheres being covered with an aluminum containing ceramic coating layer which prevents crystallization of the silica glass spheres as a result of a firing process for sintering the glass ceramic layers and which raises the softening temperature of the spheres to a temperature higher than a firing temperature of a firing process required to produce a highly reliable multi-layer wiring board;

mixing glass powders, said multitude of ceramics particles, a binder resin, a plasticizer, and a solvent to thereby form a slurry; and forming the slurry into ceramics green sheets.

18. A process according to claim 17, wherein said ceramic coating layer is alumina, mullite, spinel or aluminum nitride.

19. A process according to claim 17, wherein said silica glass spheres comprise more than 90% by weight of silica.

20. A process according to claim 17, wherein said silica glass spheres are coated with said aluminum containing ceramic coating layer by chemical vapor deposition (CVD).

21. A process according to claim 17, wherein said silica glass spheres are coated with said aluminum containing ceramic coating layer by pyrolysis.

22. A process according to claim 17, wherein said silica glass spheres are coated with said aluminum containing ceramic coating layer by plating a metal layer and then applying heat thereto to form an oxide.

23. A process according to claim 17, wherein said silica glass spheres are coated with said aluminum containing ceramic coating layer by dipping the spheres in a slurry of a ceramic and then heating the same.

24. A process according to claim 17, wherein said silica glass spheres are coated with said aluminum containing ceramic coating layer by a sol-gel method using an organic aluminum compound and spray-drying and then heating the same.

25. A process according to claim 17, wherein said silica glass spheres are coated with said aluminum containing ceramic coating layer by dipping the spheres in an inorganic aluminum compound solution and drying and then heating the same.

\* \* \* \* \*

UNITED STATES PATENT AND TRADEMARK OFFICE
CERTIFICATE OF CORRECTION

PATENT NO. : 5,593,526
DATED : January 14, 1997
INVENTOR(S) : Kishio YOKOUCHI, et al.

It is certified that error appears in the above-indentified patent and that said Letters Patent is hereby corrected as shown below:

Column 1, line 40, delete "$3Al_2O_3 \cdot 2SiO_2$" and substitute --$3Al_2O_3 \cdot 2SiO_2$--.

Signed and Sealed this

Seventeenth Day of June, 1997

Attest:

Attesting Officer

BRUCE LEHMAN

Commissioner of Patents and Trademarks